United States Patent [19]

Damon et al.

[11] Patent Number: 4,508,405

[45] Date of Patent: Apr. 2, 1985

[54] ELECTRONIC SOCKET HAVING SPRING PROBE CONTACTS

[75] Inventors: Neil F. Damon, Ft. Pierce, Fla.; Frank C. Rydwansky, Jr., Quincy, Mass.

[73] Assignee: Augat Inc., Mansfield, Mass.

[21] Appl. No.: 373,215

[22] Filed: Apr. 29, 1982

[51] Int. Cl.³ .............................................. H01R 9/09
[52] U.S. Cl. ......................... 339/75 MP; 324/158 F; 339/255 R
[58] Field of Search ......... 339/75 MP, 255 R, 176 M, 339/17 F, 108 TP; 324/158 F, 158 P, 73 PC

[56] References Cited

U.S. PATENT DOCUMENTS

| 2,742,626 | 4/1956 | Collins et al. ............. 339/255 R X |
| 3,363,220 | 1/1968 | Redd et al. ..................... 339/176 M |
| 3,787,768 | 1/1974 | Kubota et al. ................. 324/158 F |
| 4,023,878 | 5/1977 | Hennessey ........................ 339/17 F |
| 4,358,175 | 11/1982 | Reid .............................. 339/255 R X |
| 4,443,756 | 4/1984 | Lightbody et al. ......... 324/158 F X |

FOREIGN PATENT DOCUMENTS

| 4417546 | 10/1966 | Japan ............................... 324/158 P |
| 0008451 | 1/1982 | Japan ............................... 324/158 F |
| 589947 | 7/1977 | Switzerland .................... 339/255 R |

OTHER PUBLICATIONS

Catalog No. 101, *Spring Loaded Test Probes & Mating Sockets, m* published by Electronics Systems and Programming, Inc., 1977.

Catalog No. 105, *Pylon Pogo Contacts* published by Pylon Company Inc.

*Primary Examiner*—Z. R. Bilinsky
*Attorney, Agent, or Firm*—Weingarten, Schurgin, Gagnebin & Hayes

[57] ABSTRACT

An electronic component socket for leadless or leaded electronic component packages in which the package is clamped within the socket and to which positive electrical contact is made by spring loaded probes. A body of electrically insulative material has an array of parallel passages extending therethrough in a pattern corresponding to the pattern of the electrical contact areas of an associated component to be retained in the socket. A spring probe assembly is included within each passage of the socket body and includes a lower conductive member retained in the passage and having a lead outwardly extending therefrom, and an upper conductive member slidable in the passage and coupled to the lower conductive member by a coil spring. For a leadless package, a contact probe outwardly extends from the upper conductive member and in its unloaded condition projects outwardly from the passage. The probes each includes a pointed tip for mating with the respective contact areas of the leadless package. For a leaded package, the spring probe assemblies each include a socket in the upper conductive member for mating with the package terminal pins.

14 Claims, 9 Drawing Figures

ELECTRONIC SOCKET HAVING SPRING PROBE CONTACTS

FIELD OF THE INVENTION

This invention relates to electronic component sockets and more particularly to a socket for a leadless or leaded component which is clamped in the socket and electrical contact is made by spring loaded probes.

BACKGROUND OF THE INVENTION

Electronic components and circuits are known in which a substrate or carrier contains a circuit or array of electrical elements and a plurality of contact areas or leads by which electrical connection is made to the component. The substrate is usually a ceramic plate on one surface of which the circuit elements and interconnecting paths are formed. The contact areas, for a leadless package, are provided on the opposite substrate surface, or, for a leaded package, leads or pins extend from the substrate surface. The package can contain a large number of contact areas or leads which typically can be of the order of 120 to 180 contacts or leads.

A socket for retaining a leadless component conventionally includes an array of leaf-type spring contacts, each of which is matable with a respective contact area of the package. The component is installed on the leaf springs of the socket and retained in position by a clamp or latch mechanism. Such leaf spring sockets have certain disadvantages, especially where a large number of contacts are employed. The leaf springs occupy a relatively large amount of space on the socket and thereby limit the number of contacts which can be provided. In addition, solder or flux on the lead of the leaf contact can flow onto the contact and cause contamination of the contact.

A conventional socket for a multi-pin leaded component includes an array of socket openings, each for acceptance of a respective pin. The insertion and removal forces on the component are a function of the number of pins of the component, and such forces can be very high for a component having a large number of pins, such as a 120 to 180 pin package. Moreover, the socket openings are configured to tightly engage the lead pins, and the close tolerances between the pin dimensions and socket contact dimensions require careful alignment of the pins when inserting a component. Misalignment of any of the package pins can hamper or prevent component insertion.

Spring loaded test probes are employed in sockets or fixtures which are part of automatic electronic test systems used for the testing of electronic circuits. The test fixture is composed of an array of spring probes arranged in a row-and-column array known as a "bed of nails." The probe tips are of a configuration to contact the contact area or lead of a circuit to be tested, and the terminals of those probes which are in contact with the particular circuit under test are connected to the test system. These spring probes are relatively large and of elaborate construction, and are designed to be repeatedly loaded and unloaded as circuits are installed and removed for testing, and thus are relatively expensive and are not of a construction or cost practical for a component socket.

SUMMARY OF THE INVENTION

This invention provides an electronic component socket for leadless or leaded electronic component packages in which the package is clamped within the socket and to which positive electrical contact is made by spring loaded probes. The socket comprises a body of electrically insulative material having an array of parallel passages extending therethrough in a pattern corresponding to the pattern of the electrical contact areas of an associated component to be retained in the socket. A spring probe assembly is included within each passage of the socket body and includes a lower conductive member retained in the passage and having a lead outwardly extending therefrom, and an upper conductive member slidable in the passage and urged to an outward position by a coil spring. For a leadless package, a contact probe outwardly extends from the upper conductive member and in its unloaded condition projects outwardly from the passage. The probes each includes a pointed tip for mating with the respective contact areas of the leadless package. The body includes spring clips or other retaining means for retention of a component in the socket.

Upon insertion and seating of a component in the socket, the contact tips of the spring probe assemblies are caused to depress and are in positive engagement with the respective contact areas by the urging of the springs. Release of the spring clips or other retaining means causes the component of pop out of the socket by action of the spring probe assemblies returning to their unloaded state. In alternative embodiment, the spring probe assemblies each include a socket in the upper conductive member for mating with terminal pins of a leaded component package. The socket leads are isolated from the contact areas of the socket such that no contamination of the contact areas, such as from soldering, can occur. The socket and its spring probe assemblies can be readily fabricated at low cost and in efficient high volume.

DESCRIPTION OF THE DRAWINGS

The invention will be more fully understood from the following detailed description taken in conjunction with the accompanying drawings, in which.

DETAILED DESCRIPTION OF THE INVENTION

Figure 1:
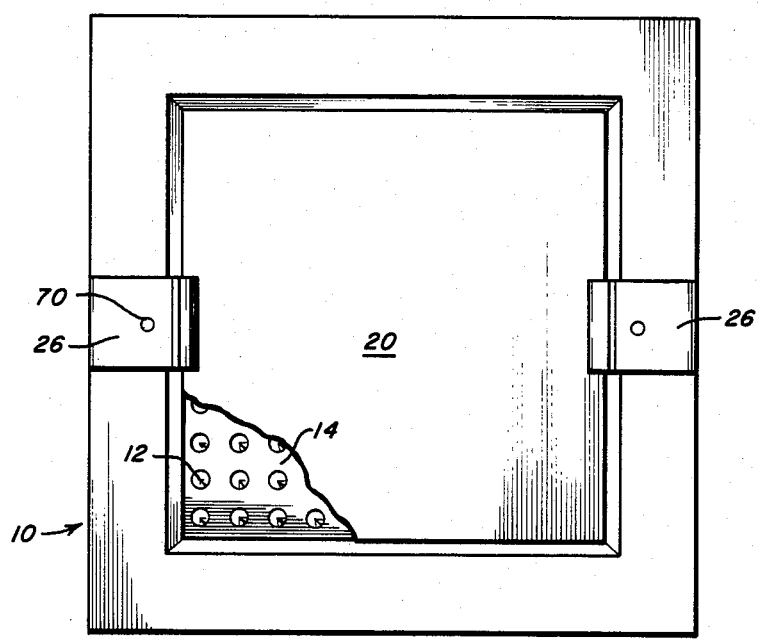
FIG. 1 is a top view of a socket in accordance with the invention.
Figure 6:
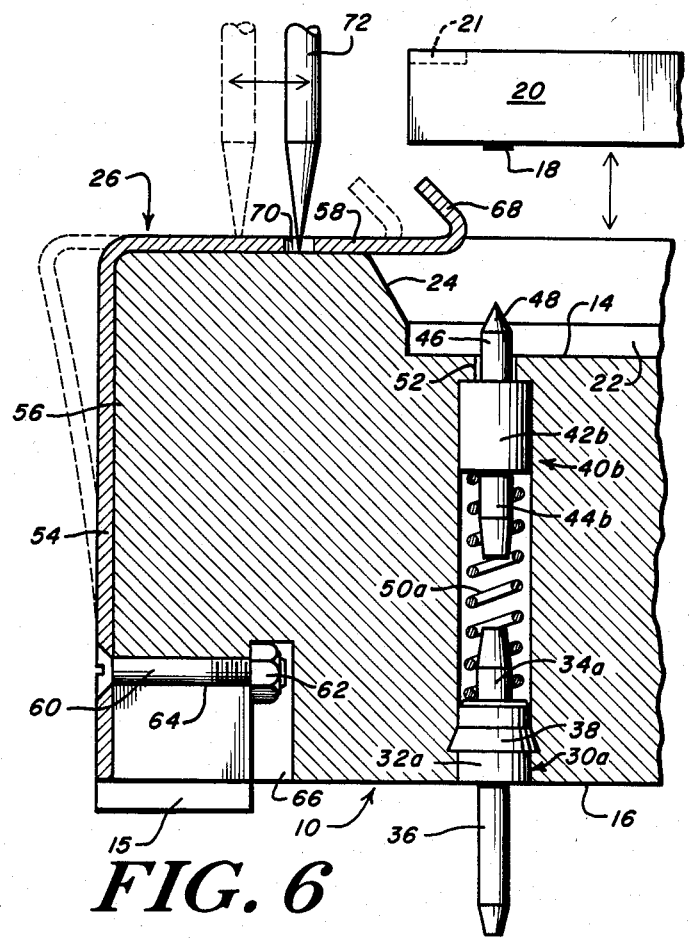
FIG. 6 is a sectional elevation view of an alternative spring probe assembly in its unloaded condition.
Figure 7:
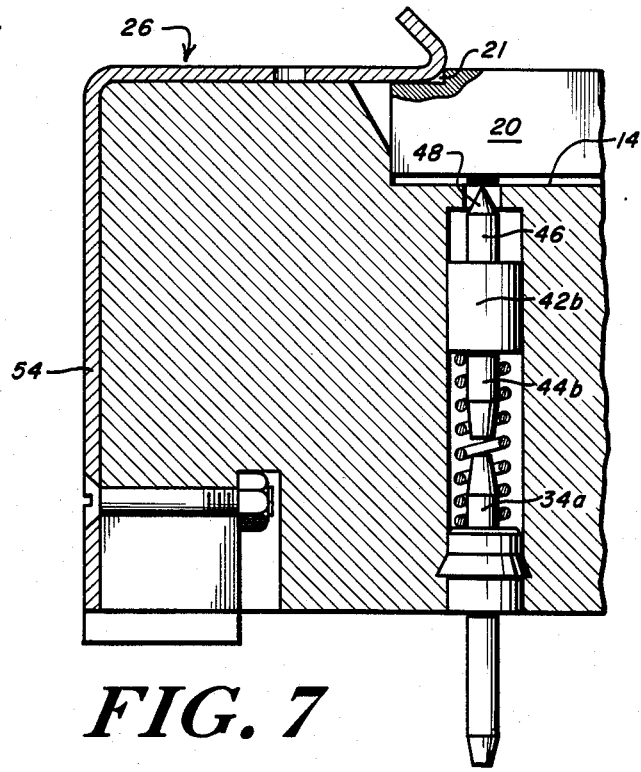
FIG. 7 is a sectional elevation view of the spring probe assembly of FIG. 6 in its loaded condition.

Referring to FIGS. 1, 6, and 7 of the drawings, there is shown a socket constructed and operative in accordance with the invention and which comprises a body 10 of electrically insulative material having an array of parallel passages 12 extending therethrough and providing communication between the top surface 14 and bottom surface 16 of the body. The array of passages is in a configuration corresponding with the array of contact areas 18 of an electric component 20 which is to be mated with the socket. The component 20 is disposed within a recess 22 in the upper surface of body 10 and is retained therein with the electrical contact areas 18 of the component in engagement with respective spring contacts each disposed within a respective passage of the array, as will be described. Inwardly sloping walls 24 may be provided around the mounting recess 22 of the body to facilitate guidance of the component into the mounting recess. The component is retained in the recess by spring clips 26 on respective opposite sides of the body. Standoffs 15 are provided at the corners of the body to raise the bottom surface 16 off of the mounting surface, as is known.

Figure 2:
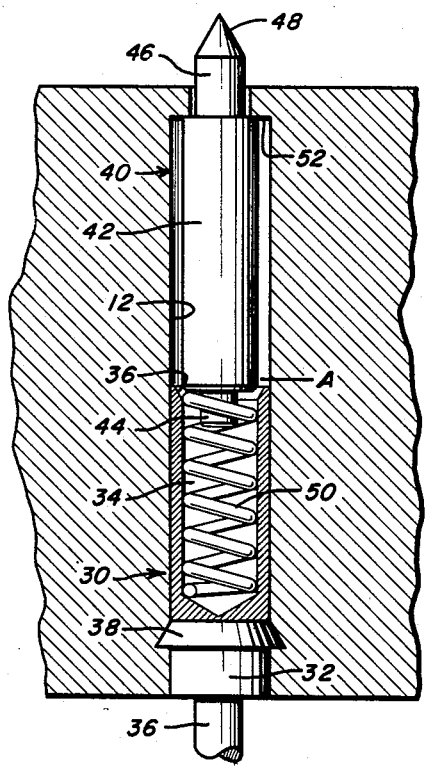
FIG. 2 is a sectional elevation view of a spring probe assembly in its unloaded condition.
Figure 3:
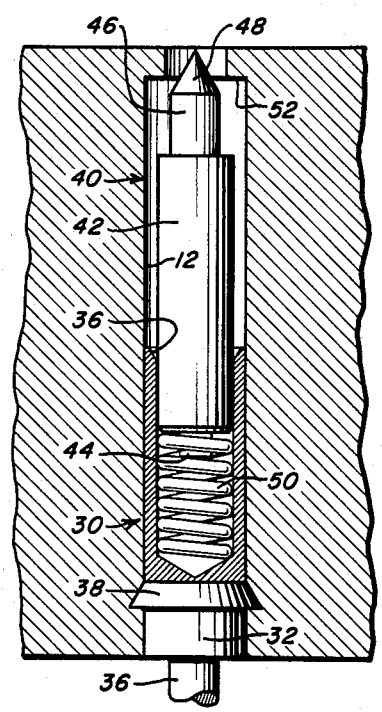
FIG. 3 is a sectional elevation view of the spring probe assembly in its loaded condition.
Figure 4:
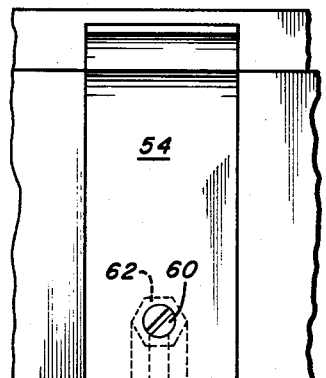
FIG. 4 is a cutaway side view illustrating the attachment of a retaining clip to the socket body.

A spring probe assembly is provided in each passage of the socket body and is illustrated in FIGS. 2 and 3. Each spring probe assembly includes a conductive member 30 having a cylindrical body 32, and an outwardly extending lead or pin 36. The cylindrical body 32 is sized to be inserted into the confronting portion of the passage 12 and is retained therein by a flared flange 38 which bites into the body 10 upon insertion of the body 32. The inner end of the body 32 has a blind opening 34 which terminates in a chamferred end 36. A second electrically conductive member 40 is disposed in the passage 12 and includes a cylindrical body 42 slidable within the passage 34, an inwardly extending post 44 coaxial with the body 42, and an outwardly extending tip 46 which terminates in a pointed contact 48 adapted to engage a confronting contact area 18 of a component 20 seated in the socket. A coil spring 50 is disposed in opening 34 substantially along the length thereof, and one end of which is around the post 44. The post 44 serves to locate the confronting end of the spring, and is not essential in all embodiments. The assembly is easily installed in the socket body by inserting body 42 in the passage 12, then inserting body 42 and spring 50 and seating the body 42 in the passage.

In its normal expanded condition, as illustrated in FIG. 2, the spring urges the upper member 40 to its outermost position as illustrated, with the tip 46 extending through the upper opening of the passage. The body 42 is retained in the passage by the surrounding shoulder 52 at the upper end of the passage 12. In the upward or uncompressed state, as illustrated in FIG. 2, the lower end of the body 42 is at the entrance to opening 34. The inner end of the body 42 is chamferred, and preferably the full diameter end of the body, noted by reference letter "A" in FIG. 2, is just entering the opening 34. Referring to FIG. 3, as the tip 46 is depressed, the body 42 slides into the opening 34 against the urging of the coil spring 50, and the cylindrical surface of the body 42 misaligns and makes contact directly with the walls of the opening 34 in which it is being depressed. Such misalignment will naturally occur from the tolerances of the parts and the forces causing downward movement of the contact member into the surrounding opening, and the forces of the compressed spring. The outwardly extending pin or lead 36 is connected to a circuit with which the component 20 is employed, and this pin or lead can be of any suitable configuration as desired, such as wire wrap pins, solder pins, or the like.

Electrical contact is primarily made between the body 42 and body 32, and the inductance due to the coil spring is substantially minimized. The spring also provides electrical connection between the bodies 42 and 32, but such spring connection is usually of much higher electrical resistance than the lower resistance path provided by the direct mating surfaces of the body 42 and the wall of opening 34.

Figure 8:
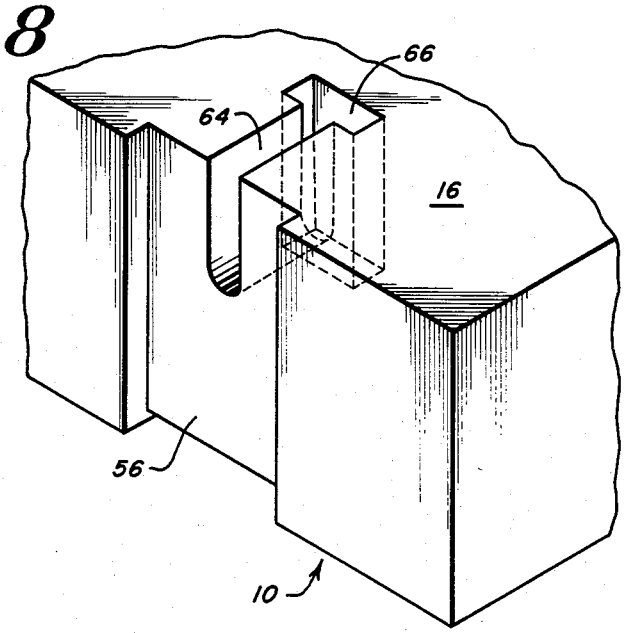
FIG. 8 is a cutaway bottom view of the openings in the socket body for retaining the spring clips.

As seen in FIGS. 6 and 7, each spring clip 26 is of L-shaped configuration having a side section 54 disposed within a groove 56 in the respective side of the body, and an upper section 58 overlying the upper surface of the socket periphery, also in a groove, such that the clips are flush with the socket body. The spring clip is retained on the body by a threaded fastener 60 which is retained by a nut 62 in the manner illustrated. The fastener 60 is disposed in an opening 64, and the nut is retained in an opening 66 provided in the body. Preferably the threaded fastener is a flat-head screw so that the head can be flush with the outer surface of the spring clip when fully threaded into the body. The openings in the body, also depicted in FIG. 8, accommodate the fastener and nut and are along a single axis for cost and efficiency of molding, since all mold openings are along one axis. The upper section 58 of the spring clip terminates in a turned end 68 which is flared to provide guidance of a component being inserted. An opening 70 is provided in the upper section of the clip for insertion of a tool 72 such as a screwdriver by which the clip can be retracted, as illustrated in FIG. 6. When the component 20 is pressed down onto the flared ends 68 of the clips 26, the clips spring back to allow the component to enter and seat into the socket recess 22, and the spring clips snap over the top of the component to hold it in place. After full insertion of the component, the spring clips 26 are allowed to return to their normal position, as shown in FIG. 7, with the inner end of the clip disposed over the component and against which the component is urged by the upward force of the spring probes. To remove a component previously installed in the socket, the respective spring clips are retracted by a tool or with the finger to permit the component to pop out of the socket under the urging of the spring probes which are returned to their upward or unloaded condition shown in FIG. 6. The upper surface of the component 20 can include grooves 21 to accommodate the clips.

Figure 5:
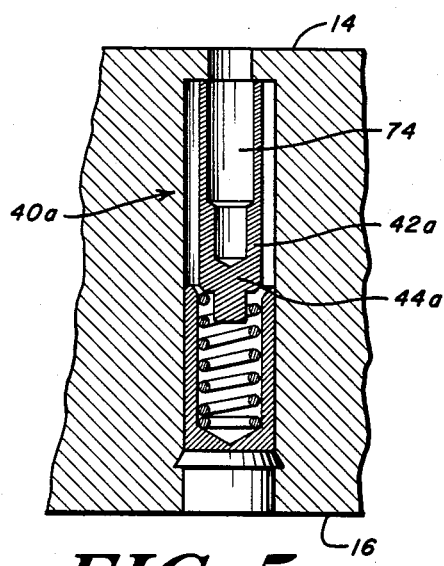
FIG. 5 is a sectional elevation view of an alternative spring probe assembly having a socket for mating with a component lead pin.

The novel socket can also be embodied for use with components having terminal pins or leads rather than the leadless components for which the above embodiment is constructed. An alternative embodiment of the spring probe assembly is shown in FIG. 5 wherein the upper conductive member 40a includes a socket for mating with a terminal pin of a component mounted on the socket. The conductive member 40a includes a cylindrical body 42a, with a socket opening 74 provided therein in alignment with the upper opening in the body. The socket opening 74 loosely accepts the terminal pin of the associated component, the pin bottoming out at the inner end of the opening 74 to make electrical contact. The spring-loaded assembly is operative in the manner described to provide positive engagement between the socket contacts and the component terminals.

An alternative embodiment of the spring probe assembly is shown in FIGS. 6 and 7 wherein the conductive member 40b is slidable within the passage 12, and includes a cylindrical body 42b slidable within the passage, an inwardly extending post 44b coaxial with the body, and an outwardly extending tip 46. The conductive member 30a includes a cylindrical body 32a, an inwardly extending post 34a coaxial with the body and an outwardly extending lead or pin 36. A coil spring 50a is disposed around the posts 34a and 44b. In its normal expanded condition, illustrated in FIG. 6, the spring urges the upper member 40b to its outermost position with the tip 46 extending through the upper opening of the passage. The spring probe assembly is illustrated in FIG. 7 in its compressed condition in which the contact 48 is in engagement with the confronting contact area of the mounted component. In this embodiment, electrical connection between the upper and lower conductive members is made via the coiled spring, and the spring will exhibit some electrical inductance. The inductance can be controlled by the size of the coil and the number of coil turns to maintain the inductance within a tolerable range.

Figure 9:
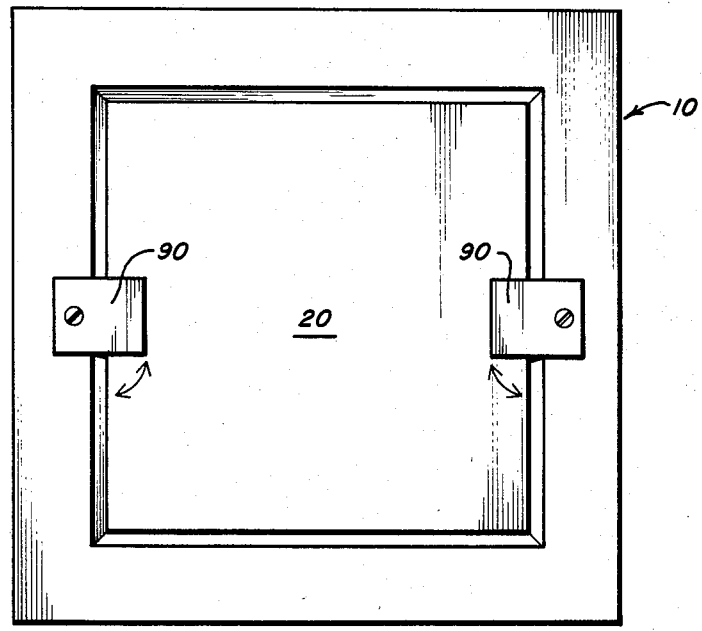
FIG. 9 is a top view of the socket with an alternative retaining mechanism.

Alternative mechanisms for retaining a component in the socket can be employed. For example, in FIG. 9, pivot clips 90 are provided on respective opposite sides of the body 10 and which are rotatable between a latched position and an open or unlatched position to permit insertion and removal of a component from the socket. A slot can be provided in the clip to permit rotation such as by a screwdriver or with the fingernail of a user. If desired, more than two pivot clips can be provided, such as one on each of the four sides of the socket body.

The socket body is fabricated of a thermoplastic material such as polyester. The conductive members of the spring probe assemblies are typically composed of brass or beryllium copper. The spring can also be composed of beryllium copper, or can be formed of stainless steel to achieve a higher electrical resistance. The socket is of square or rectangular configuration sized to accommodate differently sized components. In one typical implementation, the socket is 1.5" square, with a body height of 0.360", and with each spring probe assembly having an outside diameter of 0.050".

The invention is not to be limited by what has been particularly shown and described except as indicated in the appended claims.

What is claimed is:

1. An electronic component socket comprising:
  a body of electrically insulative material having first and second opposed surfaces, with said second surface having a recess adapted to receive said electronic component; said body having an array of parallel passages of a first diameter extending from the first surface into the body and having an array of openings of a second diameter extending from the second surface into the body corresponding ones of which are communicating with a respective passage and being of smaller second diameter than the first diameter of the respective passage;
  means adjacent the recess of the second surface of the body defining locating surfaces operative to laterally position the component received in the recess of the second surface;
  a plurality of spring probe assemblies individually disposed in a respective passage and its communicating opening and each including:
  a first electrically conductive member having means for retaining the member in the corresponding passage, and a lead outwardly extending from the first surface of the body;
  a second electrically conductive member slidably disposed in the passage and having a contact portion confronting a corresponding one of said openings;
  an electrically conductive coil spring connected between the first and second conductive members and operative to urge the second member to an outer position with the contact portion in alignment with the corresponding opening;
  retaining means attached to the body and being movable to an open position to permit reception of the electronic component in the recess of the second surface and being moveable to a closed position to removably retain the component received on the second surface of the body.

2. The socket of claim 1 wherein the first member includes a cylindrical body sized to be inserted into the respective passage, and a flared flange for retaining the cylindrical body in the passage.

3. The socket of claim 2 wherein the first member further includes an opening in the cylindrical body in which the coil spring is disposed;
  the second member having a cylindrical body slidable within the opening in the cylindrical body of the first member;
  the cylindrical bodies being in electrical contact when the spring probe assembly is in a compressed state with the cylindrical body of the first member within the opening of the second member.

4. The socket of claim 1 wherein the first member includes means for retaining the confronting end of the coil spring.

5. The socket of claim 1 wherein the second member includes a contact tip slidably disposable through the opening in the body and outwardly extendable from the first surface.

6. The socket of claim 1 wherein the second member includes a socket confronting the opening in the body for mating with a terminal pin of a component mounted on the socket.

7. The socket of claim 1 wherein the first member includes means for retaining one end of the coil spring;
  and wherein the second member includes means for retaining the other end of the coil spring, electrical connection between the first and second conductive members being provided by the coil spring in engagement therebetween.

8. The socket of claim 1 wherein the retaining means includes:
  a plurality of retaining clips disposed on respective opposite sides of the body, each clip having a portion extending parallel to the first surface and cooperative with locating means on the body;
  the clips being moveable to an open position to permit insertion of a component and being moveable to a closed position to retain the component in seated position in the body.

9. The socket of claim 8 wherein the body includes grooves in which the retaining clips are disposed to provide substantially flush mounted clips.

10. The socket of claim 8 wherein the retaining clips each include flared ends confronting the second surface of the body and operative to provide guidance of a component being inserted into the socket.

11. The socket of claim 1 wherein the body includes guide means adjacent to the locating means to provide guidance of a component being inserted into the socket.

12. For use with an electronic component having a plurality of electrical contact areas disposed in a predetermined pattern on one surface thereof, a socket comprising:

a body of electrically insulative material having first and second opposed surfaces, having an array of parallel passages of a first diameter in a pattern to be in alignment with the pattern of the contact areas of the associated component, the passages extending from the first surface into the body, and having an array of openings each of a second diameter in the second surface opposite to the first surface, each opening communicating with a respective passage with the second diameter being smaller than the first diameter;

means adjacent the second surface of the body defining locating surfaces operative to position the component installed thereon;

a plurality of spring probe assemblies individually disposed in a respective passage and its associated opening and each including:

a first electrically conductive member having means for retaining the member in the corresponding passage, a lead outwardly extending from the first surface of the body, and an opening confronting the opening in the second surface;

a second electrically conductive member slidably disposed in the passage and having a contact tip slidably disposable through the corresponding opening in the second surface and outwardly extendable from the second surface;

an electrically conductive coil spring disposed in the opening in the first member and operative to urge the second member to an outer position with the contact tip extending through the opening in the second surface;

retaining means attached to the body and being moveable to an open position to permit insertion of the component and being moveable to a closed position to retain the component in seated position on the second surface of the body;

the second member being slidable into the opening in the first member against the urging of the coil spring upon installation of the component.

13. The socket of claim 12 wherein the first member includes a cylindrical body sized to be inserted into the respective passage and containing said opening confronting the opening in the second surface, and wherein the retaining means includes a flared flange circumferentially extending from the cylindrical body;

and wherein the second member includes a cylindrical body having a diameter for slidable insertion in the opening in the first member, the upper end of the cylindrical body being in engagement with the rim of the openings in the second surface when in its outer position.

14. The socket of claim 13 wherein the second member in its outer position has a lower end at the entrance of the opening in the first member;

and wherein the coil spring is disposed substantially along the entire length of the opening in the first member and in engagement with the confronting end of the second member.

* * * * *